(12) United States Patent
Sakaguchi et al.

(10) Patent No.: US 8,299,370 B2
(45) Date of Patent: Oct. 30, 2012

(54) WIRING BOARD AND METHOD OF MANUFACTURING THE SAME

(75) Inventors: Hideaki Sakaguchi, Nagano (JP); Akinori Shiraishi, Nagano (JP); Mitsutoshi Higashi, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 263 days.

(21) Appl. No.: 12/709,838

(22) Filed: Feb. 22, 2010

(65) Prior Publication Data

US 2010/0212950 A1 Aug. 26, 2010

(30) Foreign Application Priority Data

Feb. 23, 2009 (JP) ............................. P.2009-038932
Feb. 17, 2010 (JP) ............................. P.2010-032040

(51) Int. Cl.
*H05K 1/11* (2006.01)

(52) U.S. Cl. ....................................... 174/262; 174/259

(58) Field of Classification Search .................. 174/262, 174/255, 260, 259; 361/767, 766, 768, 760, 361/735; 257/701, 703, 724
See application file for complete search history.

(56) References Cited

U.S. PATENT DOCUMENTS

| 5,973,396 A | * | 10/1999 | Farnworth | .................. 257/698 |
| 6,507,497 B2 | * | 1/2003 | Mashino | ..................... 361/767 |
| 6,815,348 B2 | * | 11/2004 | Mashino | ..................... 438/672 |
| 2006/0120056 A1 | * | 6/2006 | Sasaki | ......................... 361/735 |
| 2006/0218782 A1 | * | 10/2006 | Tuominen et al. | ............. 29/840 |
| 2010/0129960 A1 | * | 5/2010 | Mejima et al. | ............... 438/107 |
| 2010/0246141 A1 | * | 9/2010 | Leung et al. | .................. 361/735 |

FOREIGN PATENT DOCUMENTS

JP 2002-31650 1/2002

* cited by examiner

*Primary Examiner* — Yuriy Semenenko
(74) *Attorney, Agent, or Firm* — Drinker Biddle & Reath LLP

(57) ABSTRACT

A wiring board includes a first substrate portion including a first feed-through conductor portion in a vertical direction, a second substrate portion provided on the first substrate portion and including a second feed-through conductor portion in a vertical direction of a corresponding part to the first feed-through conductor portion, and a feed-through electrode including the first feed-through conductor portion and the second feed-through conductor portion.

2 Claims, 13 Drawing Sheets

WIRING BOARD AND METHOD OF MANUFACTURING THE SAME

This application claims priorities to Japanese Patent Application No. 2009-038932, filed Feb. 23, 2009, and Japanese Patent Application No. 2010-32040, filed Feb. 17, 2010, in the Japanese Patent Office. The Japanese Patent Application No. 2009-038932 and the Japanese Patent Application No. 2010-32040 are incorporated by reference in its entirety.

TECHNICAL FIELD

The present disclosure relates to a wiring board and a method of manufacturing the wiring board, and more particularly to a wiring board which can be applied to a mounting substrate for mounting an electronic component thereon or a probe substrate for evaluating an electrical characteristic of an electronic component, and a method of manufacturing the wiring board.

RELATED ART

There has been a multilayer wiring board including a feed-through electrode which is to be applied to a mounting substrate for mounting an electronic component thereon or a probe substrate for evaluating an electrical characteristic of an electronic component. Patent Document 1 has described that a multilayer wiring board is formed by a ceramic substrate constituted by non-oxide ceramic in a probe card to be used for inspecting an integrated circuit formed on a semiconductor wafer.

[Patent Document 1] JP-A-2002-31650 Publication

As will be described in a column of the related art, a through hole is formed on a silicon substrate and the silicon substrate is covered with an insulating layer, and a feed-through electrode is then filled in the through hole by electrolytic plating in a silicon wiring board using silicon as a substrate. In the silicon wiring board, a thickness of the substrate is set to be comparatively great in order to obtain a stable handling property. Moreover, a reduction in a pitch of the through hole has been advanced with an enhancement in a performance of an electronic component.

For this reason, an aspect ratio of the through hole in the silicon substrate is increased. When the electrolytic plating is to be carried out, consequently, there is a problem in that an unfilled through hole is generated or a time required for the plating is increased.

SUMMARY

Exemplary embodiments of the present invention provide a wiring board in which a proper substrate strength can be obtained and a feed-through electrode can be formed in a through hole of a substrate with a high yield and production efficiency, and a method of manufacturing the wiring board.

A wiring board according to an exemplary embodiment of the invention, comprises:

a first substrate portion formed by a wafer and including a first feed-through conductor portion in a vertical direction;

a second substrate portion formed by a wafer, provided on the first substrate portion and including a second feed-through conductor portion in a vertical direction of a corresponding part to the first feed-through conductor portion; and a feed-through electrode including the first feed-through conductor portion and the second feed-through conductor portion.

The first substrate portion may include a first substrate, a through hole formed in a vertical direction of the first substrate, an insulating layer formed on upper and lower surfaces of the first substrate and an internal surface of the through hole, and the first feed-through conductor portion formed in the through hole.

Moreover, the second substrate portion may be also formed with a substantially identical structure to the first substrate portion, and a second substrate may be bonded and stacked on the first substrate in such a manner that the second feed-through conductor portion is disposed on the first feed-through conductor portion. The first and second feed-through conductor portions disposed vertically constitute the feed-through electrode of the wiring board.

Furthermore, an embedding resin may be filled in a clearance between a side surface of a through hole of the second substrate and the second feed-through conductor portion. The first substrate and the second substrate may be bonded to each other through a bonding resin layer or are directly bonded to each other based on a plasma treatment.

The insulating layer of the upper surface of the first substrate portion may be removed to expose the silicon from the upper surface of the first substrate portion, and the silicon exposed from the upper surface of the first substrate portion and the lower surface of the glass substrate of the second substrate portion may be bonded to each other through anode bonding.

In the invention, the wiring board is constituted based on the stack of the first and second substrates which are thin. Therefore, it is possible to set an aspect ratio of the through hole of the first substrate to be low. Accordingly, it is possible to considerably improve the generation of the through hole to be unfilled when carrying out the electrolytic plating over a through hole TH of the first substrate. Thus, it is possible to enhance a manufacturing yield.

Moreover, the electrolytic plating has a characteristic that a smaller height of the through hole TH to be plated has a higher average plating rate. By forming the feed-through conductor portion through the electrolytic plating with a division, accordingly, it is possible to shorten a time required for the plating more greatly than that in the related art. Thus, it is possible to enhance a production efficiency.

Moreover, the second substrate is stacked on the first substrate which is thin. Therefore, a strength of the substrate is increased additionally so that a stable handling property can be obtained. In addition, the feed-through electrode is formed by an electrolytic plated layer having a low electrical resistance. Consequently, it is possible to constitute a wiring board having an excellent electrical characteristic.

In the wiring board according to the invention, it is also possible to stack a wafer and to then cut a stacked product, and to apply the cut product to a mounting substrate or to constitute the wiring board in a wafer stacking state and to then apply the wiring board to a probe substrate.

In the wiring board according to the invention, furthermore, it is possible to use, for the first and second substrates, an insulating substrate (a wafer) such as silicon carbide or glass in addition to a semiconductor substrate (a wafer) such as silicon.

According to the exemplary embodiments of the invention, the wiring board having a proper substrate strength can be obtained and a feed-through electrode can be formed in a through hole of a substrate with a high yield and production efficiency.

Other features and advantages may be apparent from the following detailed description, the accompanying drawings and the claims.

DETAILED DESCRIPTION

An embodiment according to the invention will be described below with reference to the drawings.

RELATED ART

Figure 1A:
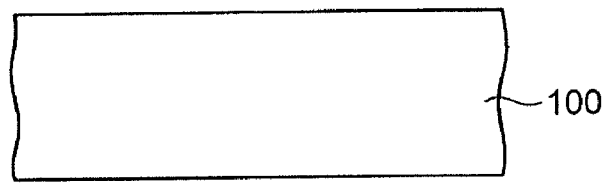
FIGS. 1A to 1E are sectional views showing a method of manufacturing a wiring board according to the related art.

Before explanation of the embodiment according to the invention, description will be given to the problems of the related art to the invention. FIGS. 1A to 1E are sectional views showing a method of manufacturing a wiring board according to the related art. In the method of manufacturing a wiring board according to the related art, as shown in FIG. 1A, a silicon wafer 100 having a thickness of approximately 400 μm is first prepared. The silicon wafer 100 is obtained by grinding a back face of a silicon wafer having a thickness of 725 μm by means of a grinder.

In the related art, there is used the silicon wafer 100 having a thickness (which is equal to or greater than 400 μm, for example) in a proper substrate strength in order to obtain a stable handling property.

Figure 1B:
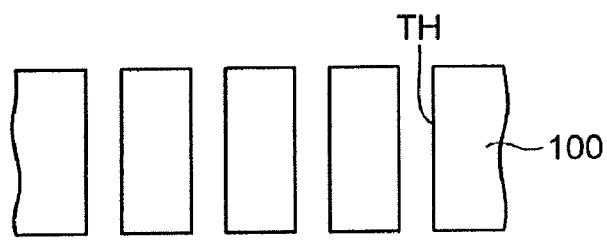

As shown in FIG. 1B, next, a resist (not shown) provided with an opening portion is formed on the silicon wafer 100 and the silicon wafer 100 is subjected to a penetration processing through anisotropic dry etching by using the resist as a mask to form a through hole TH. Then, the resist (not shown) is removed.

Figure 1C:
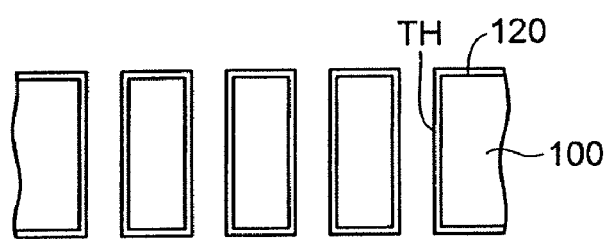

As shown in FIG. 1C, subsequently, the silicon wafer 100 is subjected to a thermal oxidation to form an insulating layer 120 constituted by a silicon oxide layer on both sides of the silicon wafer 100 and an internal surface of the through hole TH.

Figure 1D:
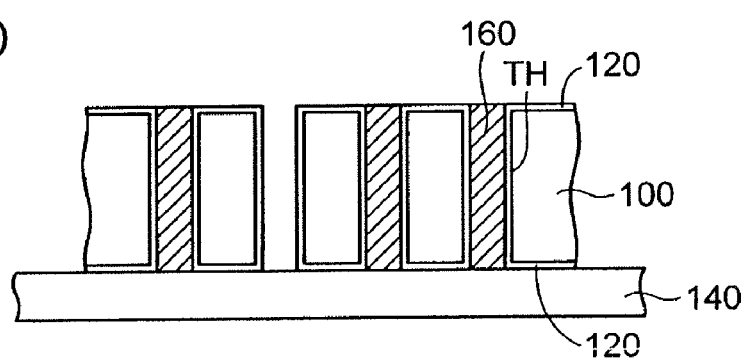

As shown in FIG. 1D, thereafter, the silicon wafer 100 in FIG. 1C is disposed on a plating feeding member 140. Furthermore, a feed-through electrode 160 constituted by a copper plated layer is filled in the through hole TH of the silicon wafer 100 by electrolytic plating utilizing the plating feeding member 140 as a plating feeding path. Subsequently, the plating feeding member 140 is removed from the silicon wafer 100.

At this time, if the silicon wafer 100 has a thickness of 400 μm and the through hole TH has a diameter of 60 μm, an aspect ratio of the through hole TH (a thickness of a silicon wafer/a diameter of a through hole) is considerably high, that is, 6.7.

Figure 1E:
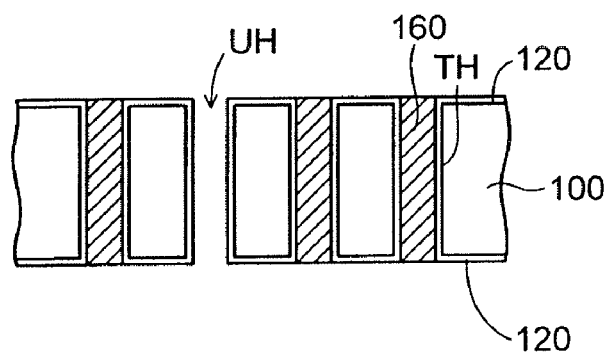

As shown in FIG. 1E, therefore, a plating solution cannot completely enter a large number of through holes TH so that a portion to be a bubble is apt to be generated due to a high aspect ratio of the through hole TH. Consequently, there is generated an unfilled hole UH which is not subjected to copper plating.

When the feed-through electrode 160 is to be filled in the through hole TH by the electrolytic plating, moreover, the copper plating is carried out upward from a lower part of the through hole TH. In the case in which the silicon wafer 100 has a great thickness, therefore, a time required for the plating is increased considerably. Thus, there is a problem in that a production efficiency is reduced.

There is a technique for filling a conductive paste in the through hole TH to form a feed-through electrode in order to increase the production efficiency. When an electronic component having a high performance is to be mounted, however, a feed-through electrode having a low electrical resistance is required. For this reason, it is hard to use a conductive paste having a considerably higher electrical resistance than that of a copper plated layer.

Thus, the silicon wiring board according to the related art has a proper substrate strength and obtains a stable handling property. However, there is a problem in that a manufacturing yield is small and a production efficiency is low.

The embodiment according to the invention which will be described below can eliminate the drawbacks.

First Embodiment

Figure 7A:
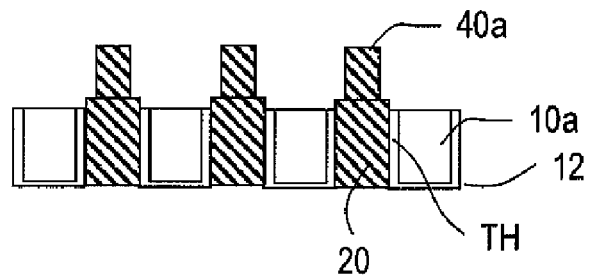
FIGS. 7A to 7D are sectional views showing a fourth bonding method in the method of manufacturing the wiring board according to the first embodiment of the invention.
Figure 7B:
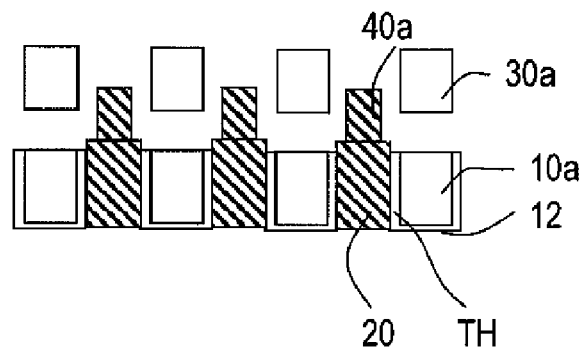
Figure 7C:
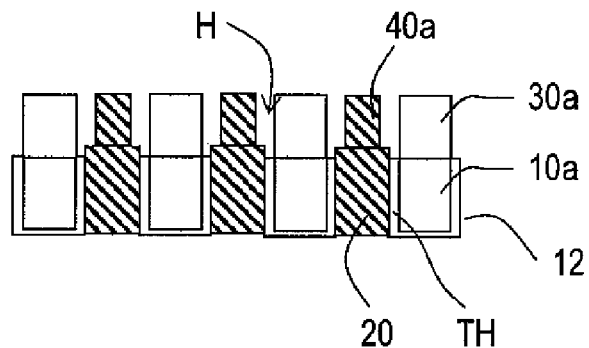
Figure 7D:
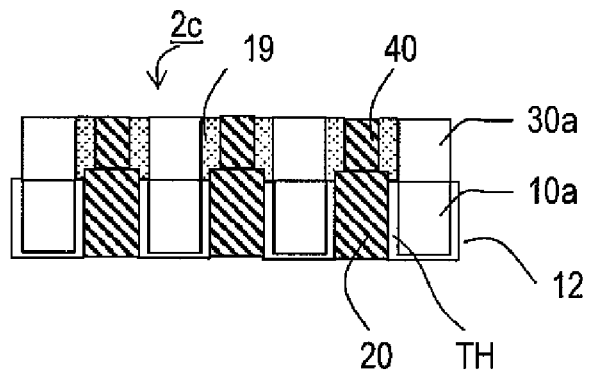
Figure 8A:
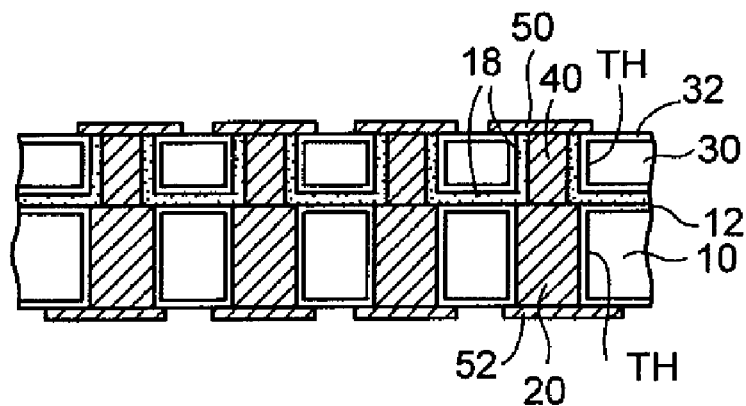
FIGS. 8A to 8C are sectional views showing the method of manufacturing the wiring board according to the first embodiment of the invention.
Figure 8B:
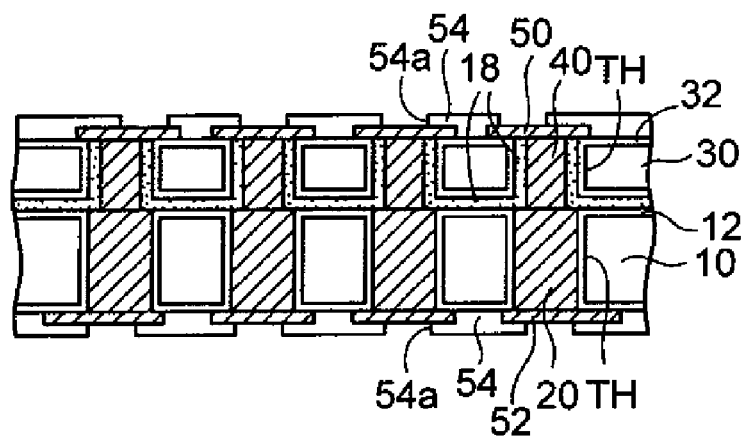
Figure 8C:
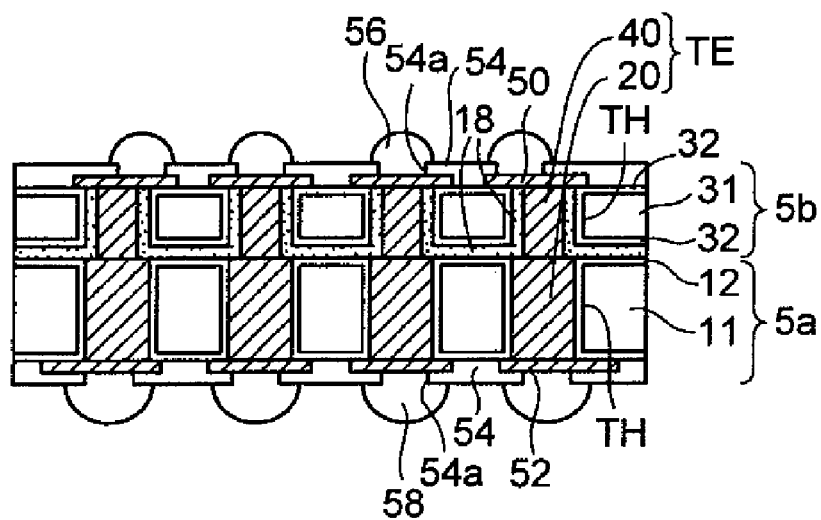
Figure 9:
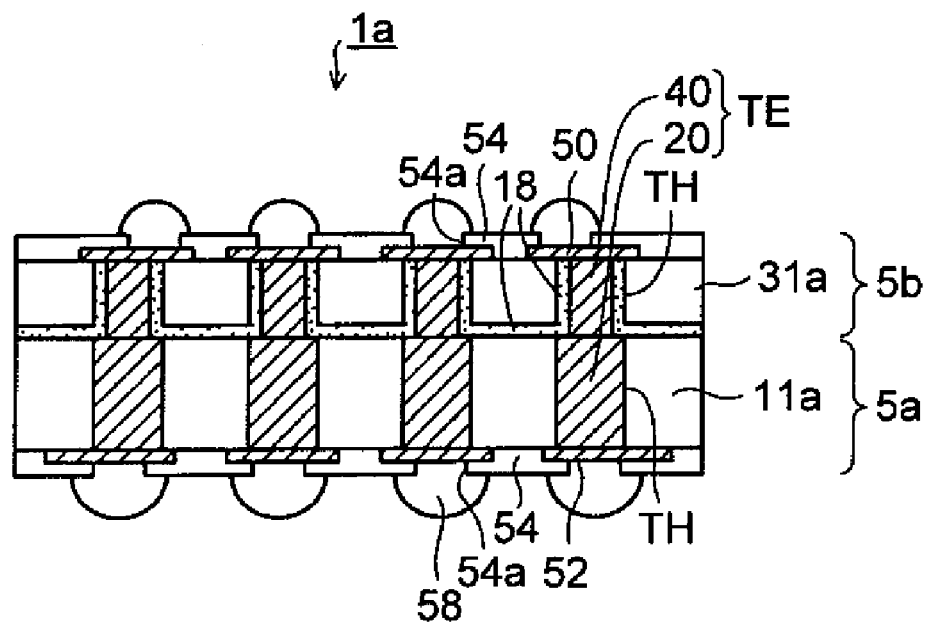
FIG. 9 is a sectional view showing a wiring board according to a variant of the first embodiment of the invention.
Figure 10:
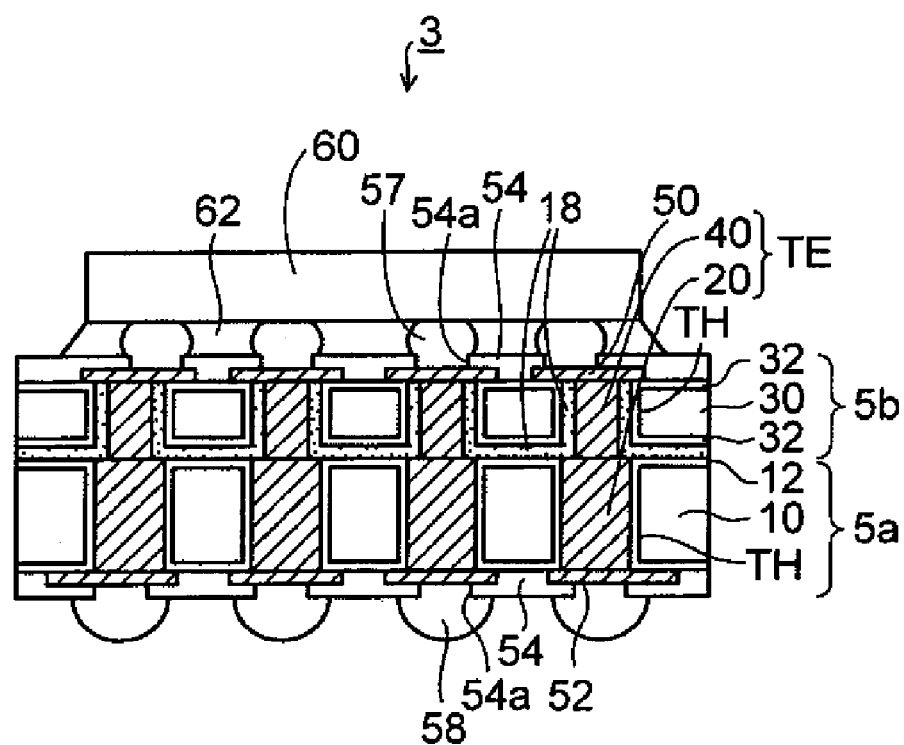
FIG. 10 is a sectional view showing an electronic component device using the wiring board according to the first embodiment of the invention.
Figure 11:
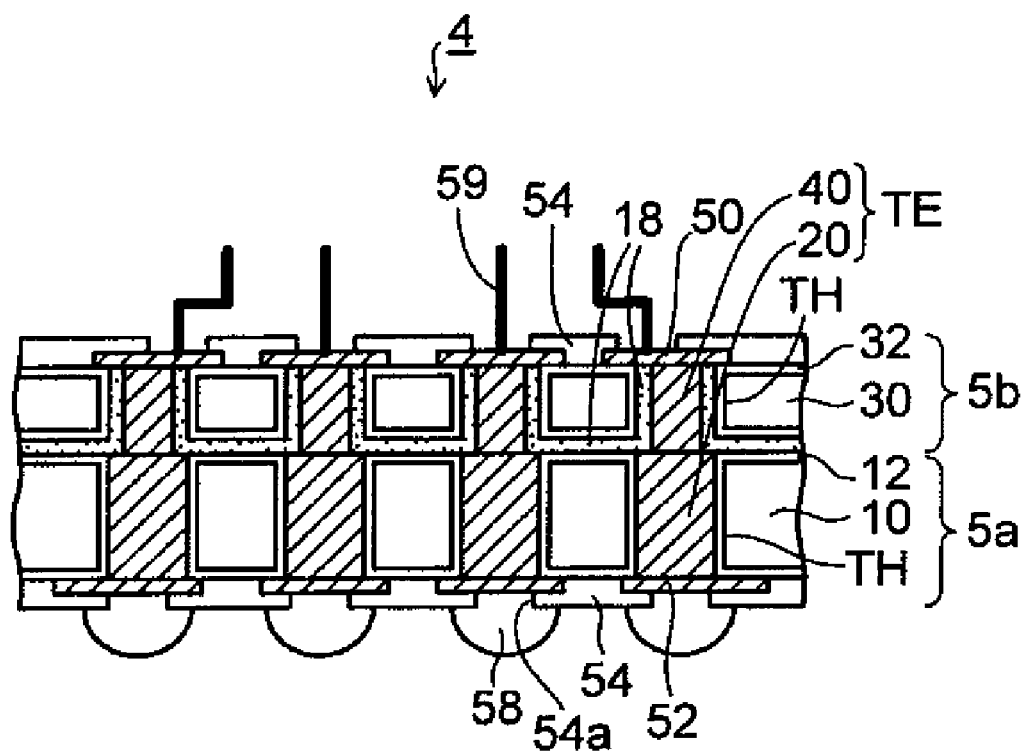
FIG. 11 is a sectional view showing a probe substrate using the wiring board according to the first embodiment of the invention.

FIGS. 2A to 8C are sectional views showing a method of manufacturing a wiring board according to a first embodiment of the invention, FIG. 9 is a sectional view showing a wiring board according to a variant, FIG. 10 is a sectional view showing an electronic component device, and FIG. 11 is a sectional view showing a probe substrate.

Figure 2A:
FIGS. 2A to 4C are sectional views showing a method of manufacturing a wiring board according to a first embodiment of the invention.

In the method of manufacturing a wiring board according to the first embodiment, as shown in FIG. 2A, a first silicon wafer 10 (a first wafer substrate) having a thickness of approximately 200 μm is first prepared. The first silicon wafer 10 is obtained by grinding a back face of a silicon wafer having a thickness of 725 μm by means of a grinder.

Although the first silicon wafer 10 having the thickness of approximately 200 μm which is thin is temporarily used in a process for manufacturing the wiring board in the embodiment, another second silicon wafer is stacked on the first silicon wafer 10 to additionally increase a substrate strength as will be described below.

Figure 2B:
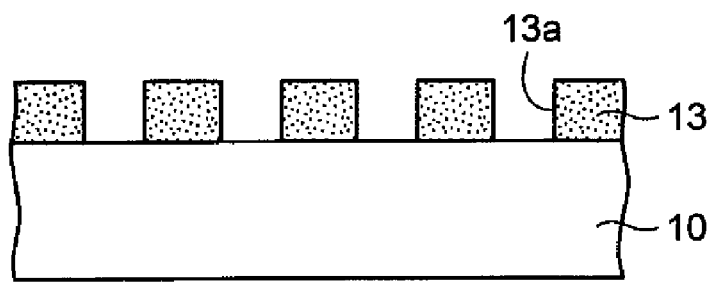
Figure 2C:
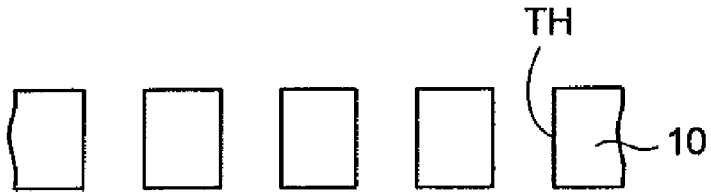

As shown in FIG. 2B, next, a resist 13 provided with a hole-shaped opening portion 13a is formed on an upper surface of the first silicon wafer 10 by photolithography. As shown in FIG. 2C, subsequently, the first silicon wafer 10 is subjected to a penetration processing by an isotropic dry etching (RIE) via the opening portion 13a with use of the resist 13 as a mask so that a through hole TH is formed. In the embodiment, a diameter of the through hole TH is set to be approximately 60 μm.

Figure 2D:
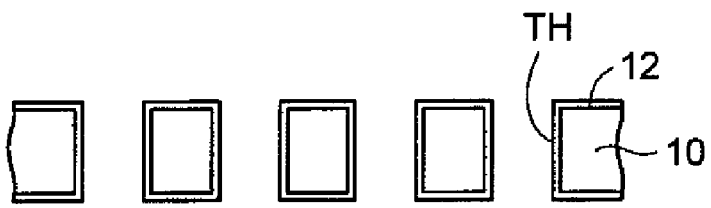

As shown in FIG. 2D, then, the first silicon wafer 10 is subjected to a thermal oxidation to form an insulating layer 12 constituted by a silicon oxide layer ($SiO_2$) on both sides of the first silicon wafer 10 and an internal surface of the through hole TH. Alternatively, the silicon oxide layer may be formed to be the insulating layer 12 by a CVD method. Moreover, a silicon nitride layer (SiN) or a silicon oxide nitride layer (SiON) may be formed to be the insulating layer 12 in place of the silicon oxide layer.

Figure 2E:
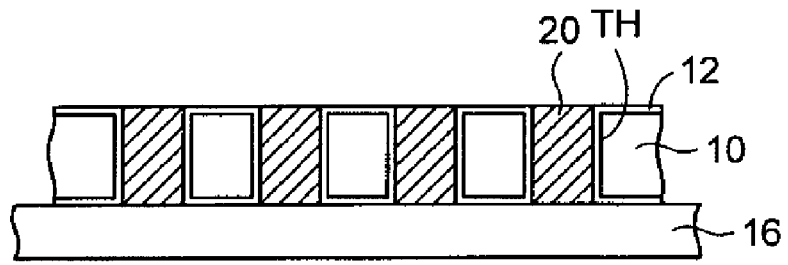

As shown in FIG. 2E, thereafter, the first silicon wafer 10 in FIG. 2D is disposed on a plating feeding member 16 such as a copper foil. Furthermore, a copper plated layer is filled upward from a lower part of the through hole TH in the first silicon wafer 10 by electrolytic plating utilizing the plating feeding member 16 as a plating feeding path so that a first feed-through conductor portion 20 is obtained. Subsequently, the plating feeding member 16 is removed from the first silicon wafer 10.

At this time, an aspect ratio of the through hole TH in the first silicon wafer 10 (a thickness (200 μm) of the silicon wafer/a diameter (60 μm) of the through hole TH) is 3.3 and is set to be considerably lower than the aspect ratio (6.7) of the through hole TH according to the related art.

Consequently, a plating solution stably enters a large number of through holes TH differently from the related art. Therefore, a generation of an unfilled through hole TH is improved greatly so that the first feed-through conductor portion 20 is formed in the large number of through holes TH with a high yield.

Moreover, the thickness of the first silicon wafer 10 is approximately a half of the thickness of the silicon wafer 100 according to the related art. Therefore, a time required for plating can be shortened to be a half of that in the related art or less. Thus, a production efficiency can be improved.

As will be described below, in the embodiment, a metal post to be a second feed-through conductor portion is formed on the first feed-through conductor portion 20 with a division. The electrolytic plating has a characteristic that a smaller height of the through hole TH gives a higher average plating rate. When obtaining the feed-through conductor portion having a desirable height, therefore, it is possible to considerably shorten the time required for the plating by the formation with the division.

In the embodiment, it is preferable to set the thickness of the first silicon wafer 10 and the diameter of the through hole TH in such a manner that the aspect ratio of the through hole TH is equal to or lower than four. The reason is as follows. There is a tendency that the unfilled through hole is generated or the time required for the plating is increased to reduce the production efficiency when the aspect ratio of the through hole TH exceeds four.

Figure 3A:
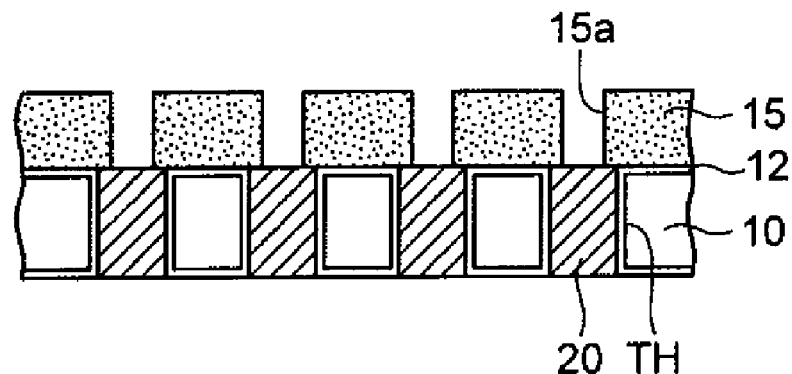

As shown in FIG. 3A, next, a resist 15 having an opening portion 15a provided on the first feed-through conductor portion 20 is formed on the first silicon wafer 10 by photolithography.

Figure 3B:
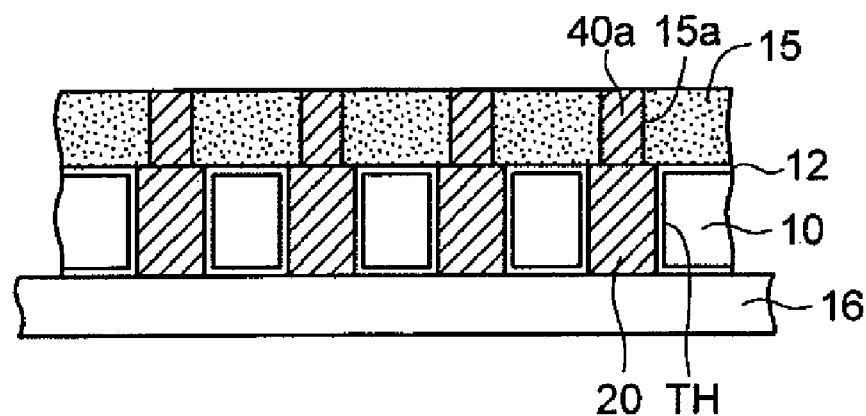

As shown in FIG. 3B, subsequently, the first silicon wafer 10 in FIG. 3A is disposed on the plating feeding member 16. Furthermore, the opening portion 15a of the resist 15 is filled with a copper plated layer to form a metal post 40a by electrolytic plating utilizing the plating feeding member 16 and the first feed-through conductor portion 20 as a plating feeding path.

Figure 3C:
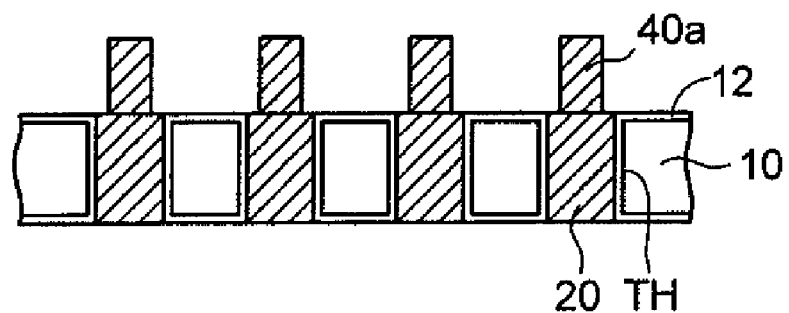

As shown in FIG. 3C, then, the plating feeding member 16 is detached and the resist 15 is removed to expose the metal post 40a. The metal post 40a is formed in an electrical connection to the first feed-through conductor portion 20. A height of the metal post 40a can be regulated depending on a film thickness of the resist 15 and is set to be 50 to 200 μm.

Next, description will be given to a method of bonding and stacking a second silicon wafer on the first silicon wafer 10. In the embodiment, first to fourth bonding methods can be proposed.

Figure 4A:
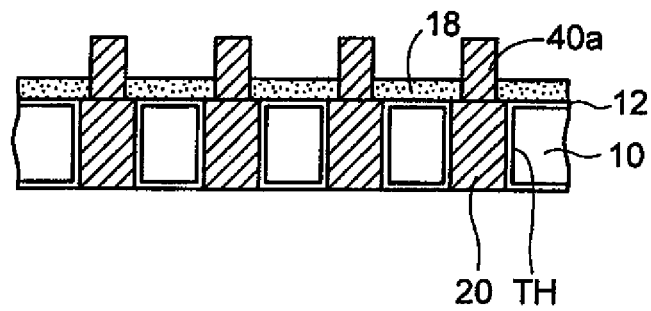
Figure 4B:
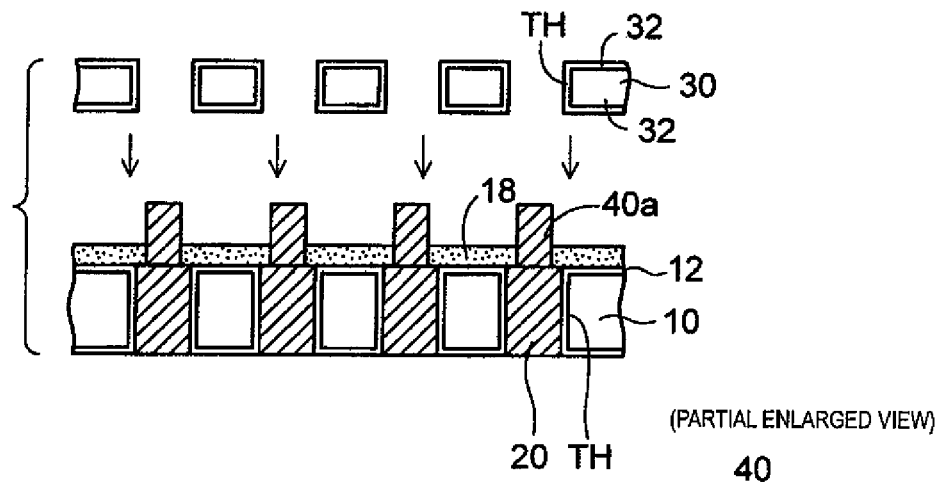
Figure 4C:
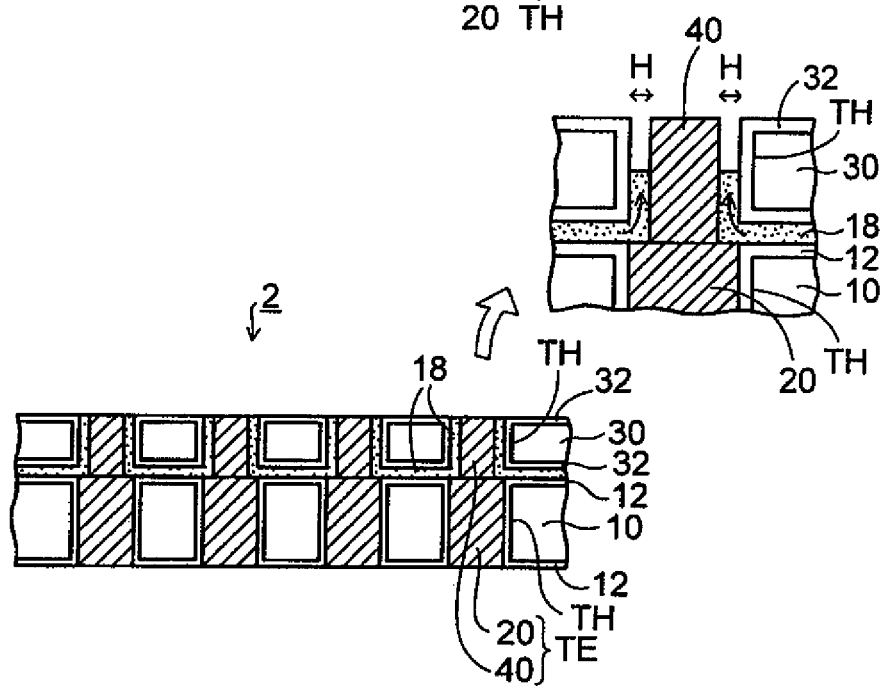

FIGS. 4A to 4C show the first bonding method. Referring to the first bonding method, as shown in FIG. 4A, a bonding resin layer 18 is formed in a part on the first silicon wafer 10 which excludes the metal post 40a. The bonding resin layer 18 is an uncured resin. For the bonding resin layer 18, an epoxy resin, a silicone resin or a polyimide resin is used. The resin functions as a bonding layer when curing is carried out by a heat treatment.

As a method of forming the bonding resin layer 18, an uncured resin sheet is stuck onto the first silicon wafer 10 and is processed by a laser to expose the metal post 40a. Alternatively, a resin sheet having an opening portion provided previously may be stuck to form the bonding resin layer 18. Furthermore, a liquid resin may be applied by printing to form the bonding resin layer 18.

As will be described below, in the first bonding method, the bonding resin layer 18 is fluidized around a side surface of the metal post 40a. Therefore, the bonding resin layer 18 is formed in a comparatively great film thickness (volume).

Subsequently, there is prepared a second silicon wafer 30 (a second wafer substrate) shown in FIG. 4B. The second silicon wafer 30 has the through hole TH formed in a corresponding part to the metal post 40a provided on the first silicon wafer 10 in FIG. 4A. Moreover, an insulating layer 32 constituted by a silicon oxide layer is formed on both sides of the second silicon wafer 30 and an internal surface of the through hole TH.

A diameter of the through hole TH of the second silicon wafer 30 is set to be a size larger than a diameter of the metal post 40a formed on the first silicon wafer 10. Moreover, a thickness of the second silicon wafer 30 is set corresponding to a height of the metal post 40a formed on the first silicon wafer 10.

As shown in FIGS. 4B and 4C, then, the second silicon wafer 30 is disposed on the first silicon wafer 10 in a state in which the metal post 40a formed on the first silicon wafer 10 is inserted into the through hole TH of the second silicon wafer 30. Furthermore, the second silicon wafer 30 is pressurized toward the first silicon wafer 20 side in a heating atmosphere of 150 to 300° C.

At this time, the bonding resin layer 18 positioned under the second silicon wafer 30 is fluidized and filled in a clearance H between a side surface of the through hole TH of the second silicon wafer 30 and the metal post 40a as shown in FIG. 4C and a partial enlarged view illustrating the process. The bonding resin layer 18 functions as a bonding layer in curing, and the first silicon wafer 10 and the second silicon wafer 30 are bonded to each other through the bonding resin layer 18.

Moreover, the metal post 40a disposed in the through hole TH of the second silicon wafer 30 is bonded to the second silicon wafer 30 through the bonding resin layer 18 filled like a ring around the metal post 40a. Consequently, the metal post 40a serves as a second feed-through conductor portion 40 disposed in the through hole TH of the second silicon wafer 30. The second feed-through conductor portion 40 provided on the second silicon wafer 30 is electrically connected to the first feed-through conductor portion 20 and is electrically insulated from the second silicon wafer 30 through the bonding resin layer 18 and the insulating layer 32.

Since a substrate strength is additionally increased by the second silicon wafer 30, consequently, the first silicon wafer 10 has a stable handling property. Moreover, the feed-through electrode TE is constituted by the first feed-through conductor portion 20 and the second feed-through conductor portion 40.

By the first bonding method, thus, the second silicon wafer 30 is stacked on the first silicon wafer 10 so that a first wiring member 2 is obtained.

Although the bonding resin layer 18 is formed on the first silicon wafer 10 in FIG. 4A, it may be formed on a lower surface of the second silicon wafer 30.

Figure 5A:
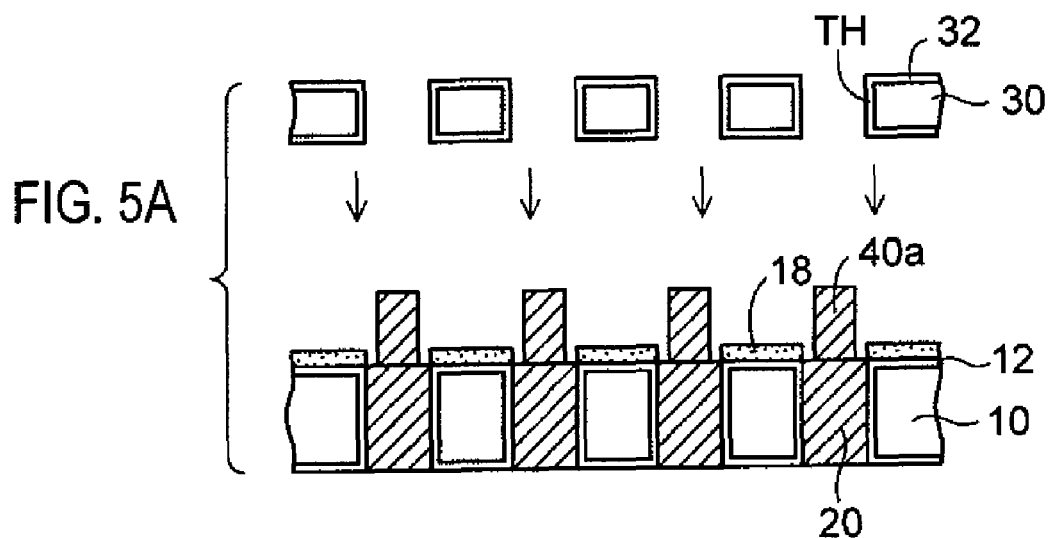
FIGS. 5A to 5C are sectional views showing a second bonding method in the method of manufacturing the wiring board according to the first embodiment of the invention.
Figure 5B:
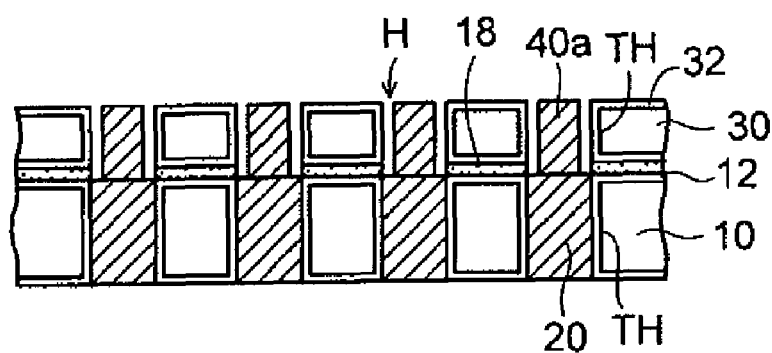
Figure 5C:
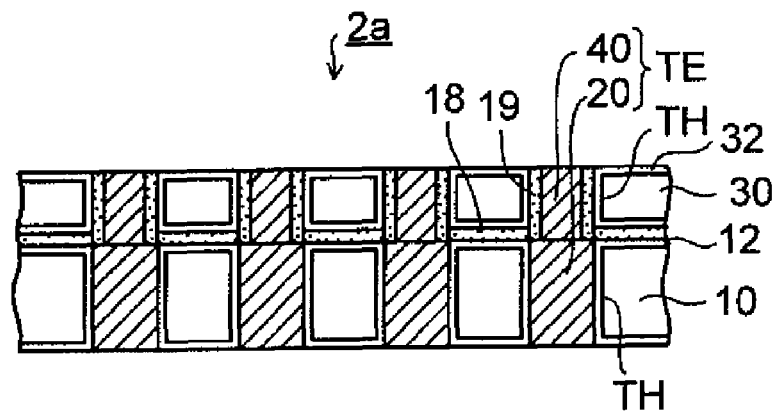

FIGS. 5A to 5C show a second bonding method. Referring to the second bonding method, the bonding resin layer 18 is prevented from being fluidized around the metal post 40a. As shown in FIG. 5A, the bonding resin layer 18 is first formed in a part on the first silicon wafer 10 which excludes the metal post 40a. At this time, a film thickness of the bonding resin layer 18 is set to be comparatively small, and furthermore, the bonding resin layer 18 is prevented from being formed in the vicinity of the metal post 40a.

Then, there is prepared the same wafer as the second silicon wafer 30 described with reference to FIG. 4B.

Subsequently, the second silicon wafer 30 is disposed on the first silicon wafer 10 in a state in which the metal post 40a formed on the first silicon wafer 10 is inserted in the through hole TH of the second silicon wafer 30 in the same manner as in the first bonding method as shown in FIGS. 5A and 5B. Furthermore, the first and second silicon wafers 10 and 30 are heated/pressurized to cure the bonding resin layer 18.

As shown in FIG. 5B, consequently, the second silicon wafer 30 is bonded and stacked on the first silicon wafer 10 through the bonding resin layer 18. Referring to the second bonding method, the bonding resin 18 is not filled between the side surface of the through hole TH of the second silicon wafer 30 and the metal post 40a so that the ring-shaped clearance H is maintained to remain in a state in which the first and second silicon wafers 10 and 30 are bonded to each other.

As shown in FIG. 5C, then, an embedding resin 19 is filled in the clearance H (FIG. 5B) between the side surface of the through hole TH of the second silicon wafer 30 and the metal post 40a.

Consequently, there is obtained a second wiring member 2a having a substantially identical structure to that of the wiring member 2 in FIG. 4C.

Figure 6A:
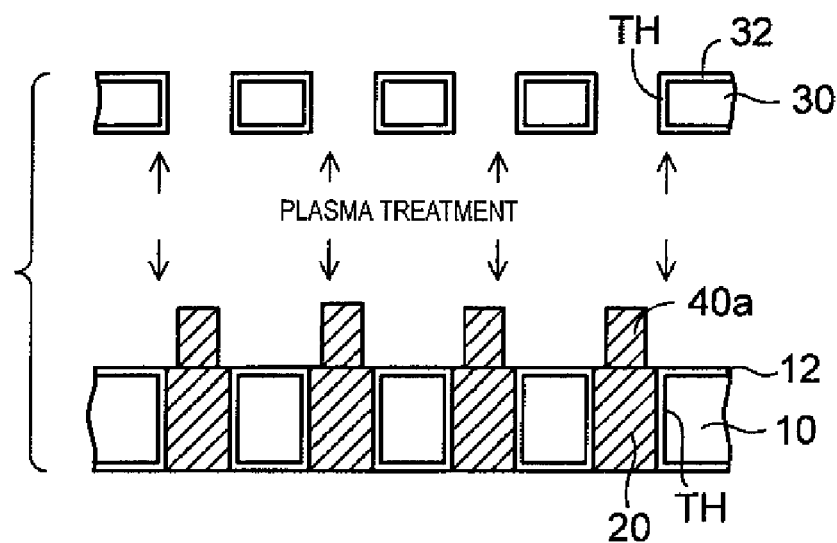
FIGS. 6A to 6C are sectional views showing a third bonding method in the method of manufacturing the wiring board according to the first embodiment of the invention.
Figure 6B:
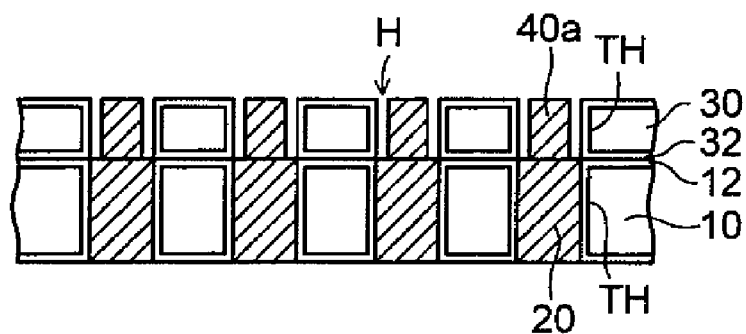
Figure 6C:
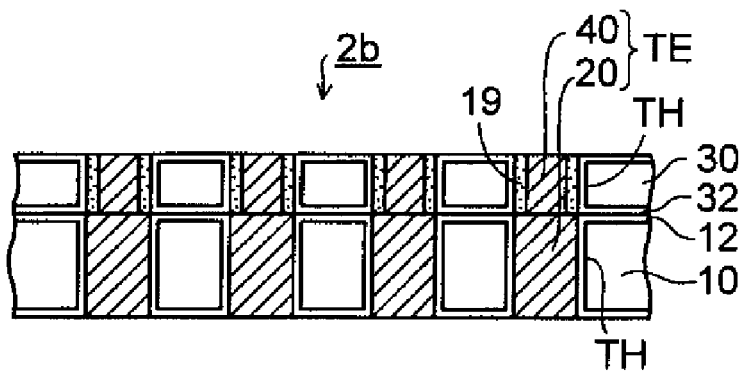

FIGS. 6A to 6C show a third bonding method. Referring to the third bonding method, the bonding resin layer is not used but the insulating layers 12 and 32 of the first and second silicon wafers 10 and 30 are directly bonded to each other.

As shown in FIG. 6A, there are prepared the first silicon wafer 10 obtained in FIG. 3C and the second silicon wafer 30 described with reference to FIG. 4B. Then, the insulating layer 12 of the first silicon wafer 10 and the insulating layer 32 of the second silicon wafer 30 are cleaned with dilute fluoric acid, an ozone solution or dilute hydrochloric acid, respectively.

Furthermore, the insulating layer 12 on the metal post 40a side in the first silicon wafer 10 is treated with a plasma such as an argon gas. Similarly, the insulating layer 32 on a lower surface (a bonding surface) side in the second silicon wafer 30 is treated with the plasma such as the argon gas.

As shown in FIG. 6B, subsequently, the second silicon wafer 30 is disposed on the first silicon wafer 10 in a state in which the metal post 40a formed on the first silicon wafer 10 is inserted in the through hole TH of the second silicon wafer 30.

In addition, the second silicon wafer 30 is pressurized toward the first silicon wafer 10 side in a heating atmosphere of 200° C. The insulating layer 12 of the first silicon wafer 10 and the insulating layer 32 of the second silicon wafer 30 are activated through the plasma treatment. Therefore, the first and second silicon wafers 10 and 30 are bonded to each other by heating/pressurization.

Referring to the third bonding method, in the case in which the bonding is carried out in a vacuum atmosphere, it is possible to bond the second silicon wafer 30 to the first silicon wafer 10 by simply carrying out the pressurization without requiring the heating.

As shown in FIG. 6C, then, the embedding resin 19 is filled in the clearance H (FIG. 6B) between the side surface of the through hole TH in the second silicon wafer 30 and the metal post 40a.

Thus, a third wiring member 2b having a feed-through electrode TE constituted by first and second feed-through conductor portions 20 and 40 is obtained by the third bonding method.

FIGS. 7A to 7D show a fourth bonding method. Referring to the fourth bonding method, as shown in FIG. 7A, there is prepared a first silicon wafer 10a obtained by removing the insulating layer 12 on the upper surface side (on the metal post 40a side) of the first silicon wafer 10 in FIG. 3C by a dry etching and the like so as to expose silicon on the upper surface side of the first silicon wafer 10a. Furthermore, there is prepared a second glass wafer 30a having the same size as the second silicon wafer 30 described with reference to FIG. 4B.

As shown in FIGS. 7B and 7C, the second glass wafer 30a is disposed on the first silicon wafer 10a in a state in which the metal post 40a formed on the first silicon wafer 10a is inserted in the through hole TH of the second glass wafer 30a.

Accordingly, the silicon on the surface of the first silicon wafer 10a and the second glass wafer 30a can be bonded to each other through anode bonding.

For an anode bonding condition, a voltage of 500 V to 1 KV is applied between both of the first silicon wafer 10a and the second glass wafer 30a with the silicon side as the anode and the glass side as the cathode in a state in which they are heated to 300 to 400° C., for example. As shown in FIG. 7C, consequently, a great electrostatic attraction is generated between the first silicon wafer 10a and the second glass wafer 30a and they are bonded to each other through a chemical bond over an interface thereof.

As shown in FIG. 7D, subsequently, the embedding resin 19 is filled in the clearance H (FIG. 7C) between the side surface of the through hole TH in the second glass wafer 30a and the metal post 40a.

By the fourth bonding method, thus, there is obtained a fourth wiring member 2c including a feed-through electrode TE constituted by the first and second feed-through conductor portions 20 and 40.

In a subsequent process, description will be given by taking, as an example, the first wiring member 2 obtained by the first bonding method. As shown in FIG. 8A, a wiring layer 50 to be connected to the second feed-through conductor portion 40 is formed on the upper surface of the second silicon wafer 30 of the first wiring member 2 in FIG. 4C.

The wiring layer 50 is formed by a semiadditive method, for example. Detailed description will be given. First of all, a seed layer (not shown) is formed on the second silicon wafer 30. Next, there is formed a plating resist (not shown) having an opening portion provided in a part in which the wiring layer 50 is to be disposed.

Subsequently, a metal pattern layer (not shown) is formed in the opening portion of the plating resist by electrolytic plating utilizing the seed layer as a plating feeding path. Furthermore, the plating resist is removed and the seed layer is then subjected to etching using the metal pattern layer as a mask. Consequently, the wiring layer 50 is obtained.

By the same method, moreover, a wiring layer 52 to be connected to the first feed-through conductor portion 20 is formed on the lower surface of the first silicon wafer 10.

As shown in FIG. 8B, then, a protection insulating layer 54 (a solder resist) provided with an opening portion 54a is formed on connecting parts of the wiring layers 50 and 52 disposed on the lower surface of the first silicon wafer 10 and the upper surface of the second silicon wafer 30, respectively. Furthermore, an Ni/Au plated layer is formed on the connecting parts of the wiring layers 50 and 52 so that a contact layer is provided if necessary.

As shown in FIG. 8C, moreover, a solder ball is mounted on the connecting part of the wiring layer 50 at the upper surface side to form a connecting bump 56. In addition, a solder ball is mounted on the connecting part of the wiring layer 52 at the lower surface side to form an external connecting terminal 58.

Then, the first and second silicon wafers 10 and 30 are cut into first and second silicon substrates 11 and 31 individually. Consequently, a wiring board 1 according to the first embodiment is obtained. A timing for cutting the first and second silicon wafers 10 and 30 may be set before the connecting bump 56 and the external connecting terminal 58 are provided.

Although the example in which two silicon wafers are stacked has been described in the embodiment, it is possible to stack an optional number of silicon wafers having n layers (n is an integer of one or more) on the first silicon wafer 10, thereby constituting a wiring board through a repetition from the step of forming the metal post 40a to the step of bonding the second silicon wafer 30 (FIGS. 3A to 4C in the first bonding method).

As shown in FIG. 8C, the wiring board 1 according to the first embodiment is basically constituted by bonding a second substrate portion 5b onto a first substrate portion 5a through the bonding resin layer 18.

The first substrate portion 5a includes the first silicon substrate 11 formed by a wafer, the through hole TH penetrating in a vertical direction thereof, the insulating layer 12 formed on both sides of the first silicon substrate 11 and the internal surface of the through hole TH, and the first feed-through conductor portion 20 filled in the through hole TH.

Moreover, the second substrate portion 5b also includes the second silicon substrate 31 formed by a wafer, the through hole TH penetrating in a vertical direction thereof, the insulating layer 32 formed on both sides of the second silicon substrate 31 and the internal surface of the through hole TH, and the second feed-through conductor portion 40 filled in the through hole TH.

The bonding resin layer 18 (an embedding resin) is filled in a clearance between the insulating layer 32 formed on the internal surface of the through hole TH of the second silicon substrate 31 and the second feed-through conductor portion 40.

The second feed-through conductor portion 40 is formed on the first feed-through conductor portion 20 in an electrical connecting state. The feed-through electrode TE penetrating through the wiring board 1 is constituted by the first feed-through conductor portion 20 and the second feed-through conductor portion 40 which are disposed vertically.

Moreover, the wiring layer 50 to be connected to the second feed-through conductor portion 40 is formed on the upper surface side of the second substrate portion 5b. The wiring layer 52 to be connected to the first feed-through conductor portion 20 is formed on the lower surface side of the first substrate portion 5a.

Furthermore, the protection insulating layer 54 having the opening portion 54a provided on the connecting parts of the wiring layers 50 and 52 are formed on the lower surface side of the first substrate portion 5a and the upper surface side of the second substrate portion 5b, respectively. In addition, the external connecting terminal 58 to be connected to the wiring layer 52 is provided on the lower surface side of the first substrate portion 5a.

Moreover, the bump electrode 56 to be connected to the wiring layer 50 is provided on the upper surface side of the second substrate portion 5b.

In the case in which the third bonding method (FIGS. 6A to 6C) is employed, the bonding resin layer 18 between the first substrate portion 5a and the second substrate portion 5b is omitted in the wiring board 1 shown in FIG. 8C. The insulating layers 12 and 32 of the first and second substrate portions 5a and 5b are directly bonded to each other.

In the case in which the fourth bonding method (FIGS. 7A to 7D) is employed, moreover, the insulating layer on the upper side and the lower surface side of the second substrate portion 5b, the insulating layer of the internal surface of the through hole TH of the second substrate portion 5b, and the upper surface side of the first substrate portion 5a are omitted in the wiring board shown in FIG. 8C. The lower surface of the second glass substrate 31 in the second substrate portion 5b is bonded to the silicon of the first substrate portion 5a through anode bonding.

The wiring board 1 according to the first embodiment is manufactured based on the stack of the first silicon wafer 10 (or 10a) and the second silicon wafer 30 (or second glass wafer 30a) which are thin. Therefore, it is possible to set a low aspect ratio of the through hole TH in the first silicon wafer 10 (or 10a) to be plated in a manufacturing process.

Accordingly, it is possible to considerably improve the generation of the unfilled through hole TH when carrying out the plating over the through hole TH of the first silicon wafer 10 (or 10a). Therefore, it is possible to enhance a manufacturing yield.

Moreover, there is reduced a height of the through hole TH in the first silicon wafer 10 (or 10a) which is to be plated. Therefore, it is possible to shorten a time required for the plating, thereby enhancing a production efficiency.

Furthermore, the second silicon substrate (or second glass substrate) 31 is stacked on the first silicon substrate 11 which is thin. Therefore, a substrate strength is increased additionally so that a stable handling property can be obtained. In addition, the feed-through electrode TE is formed by an electrolytic plated layer having a low electrical resistance. Therefore, it is possible to constitute the wiring board 1 having an electrical characteristic which is more excellent than that in the case in which a conductive paste is used.

Although the description has been given by taking the silicon as an example of the substrates of the first and second substrate portions 5a and 5b in the embodiment, it is also possible to use a semiconductor substrate (a wafer) such as gallium arsenide (GaAs) in addition to the silicon. Also in the case in which a semiconductor substrate other than the silicon is used, it is possible to constitute a wiring board with the same structure as that in FIG. 8C.

Alternatively, an insulating substrate (a wafer) such as silicon carbide (SiC) or glass may be used as the substrates of the first and second substrate portions 5a and 5b. FIG. 9 shows a wiring board 1a according to a variant in which the insulating substrate is used.

In the wiring board 1a according to the variant, first and second insulating substrates 11a and 31a are bonded and stacked through the bonding resin layer 18 in place of the first and second silicon substrates 11 and 31 in the wiring board 1 of FIG. 8C. It is not necessary to form an insulating layer on both sides of each of the first and second insulating substrates 11a and 31a and an internal surface of a through hole TH.

The first and second insulating substrates 11a and 31a are bonded to each other through the bonding resin layer 18, and the bonding resin layer 18 (an embedding resin) is also filled in a clearance between a side surface of the through hole TH in the second insulating substrate 31a and a second feed-through conductor portion 40.

In the case in which an SiC wafer is used, the through hole is formed by drilling. In the case in which a glass wafer is used, the through hole is formed by a sand blasting process. Since the other elements in FIG. 9 are the same as those in FIG. 8C, the same designations are given and description thereof will be omitted.

The wiring board 1 according to the embodiment (FIG. 8C) is used as a mounting substrate for mounting an electronic component thereon. As shown in FIG. 10, a connecting part of an electronic component 60 (a semiconductor chip) is flip-chip connected to the connecting bump 56 provided on the upper surface side of the wiring board 1 in FIG. 8C. Consequently, the electronic component 60 is connected to the wiring board 1 through a connecting electrode 57. Furthermore, an underfill resin 62 is filled in a clearance under the electronic component 60.

Consequently, an electronic component device 3 according to the first embodiment is obtained.

FIG. 11 shows an example in which the wiring board according to the first embodiment is applied to a probe substrate. As shown in FIG. 11, a probe substrate 4 according to the embodiment is used for evaluating an electrical characteristic of a silicon wafer in which an integrated circuit is formed in each chip region.

A probe pin 59 is attached to the wiring layer 50 provided on the upper surface of the wiring board in the wafer state of FIG. 8B. Furthermore, an external connecting terminal 58 is provided on the wiring layer 52 at the lower surface side of the wiring board in the wafer state.

The external connecting terminal 58 provided on the lower surface side of the probe substrate 4 is connected to a test board (not shown) and a connecting pad in each chip region of the silicon wafer is connected to the probe pin 59 provided on the upper surface side of the probe substrate 4 to evaluate the electrical characteristic of the silicon wafer including the integrated circuit.

Second Embodiment

Figure 12A:
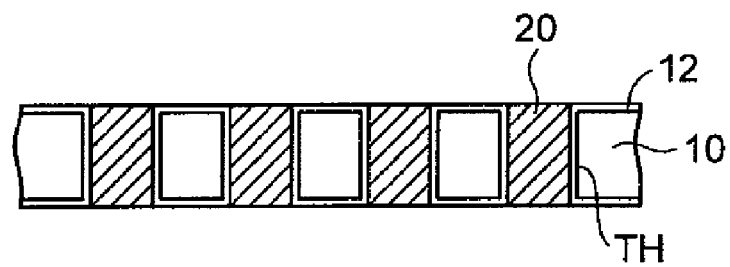
FIGS. 12A to 13C are sectional views showing a method of manufacturing a wiring board according to a second embodiment of the invention.
Figure 12B:
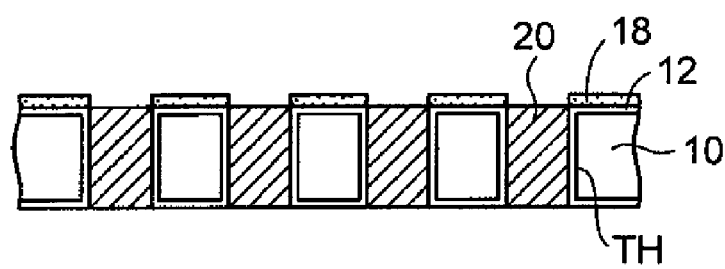
Figure 12C:
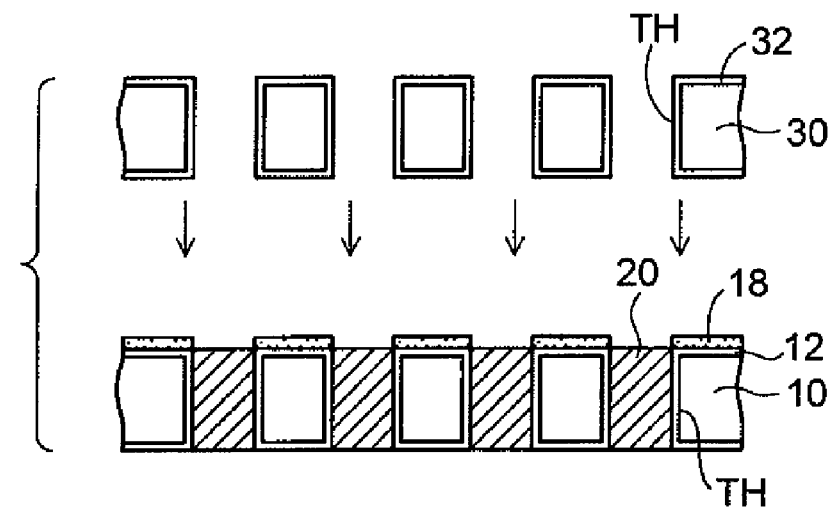
Figure 12D:
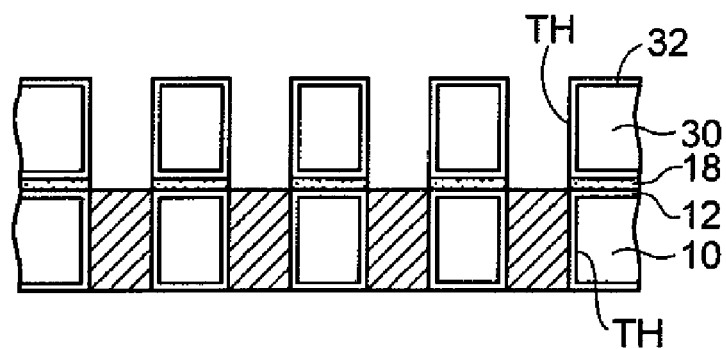
Figure 13A:
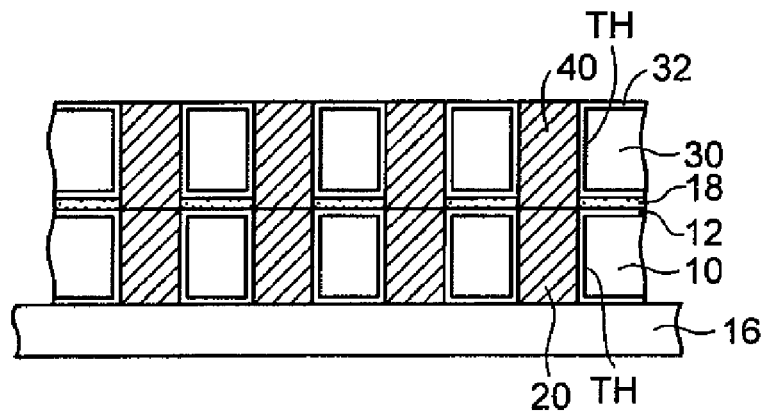
Figure 13B:
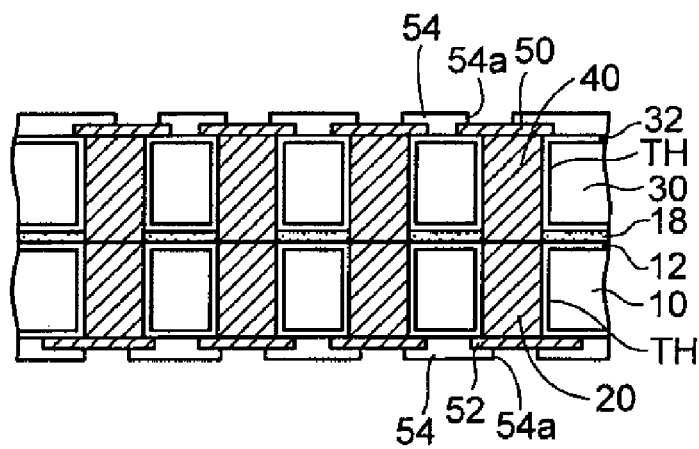
Figure 13C:
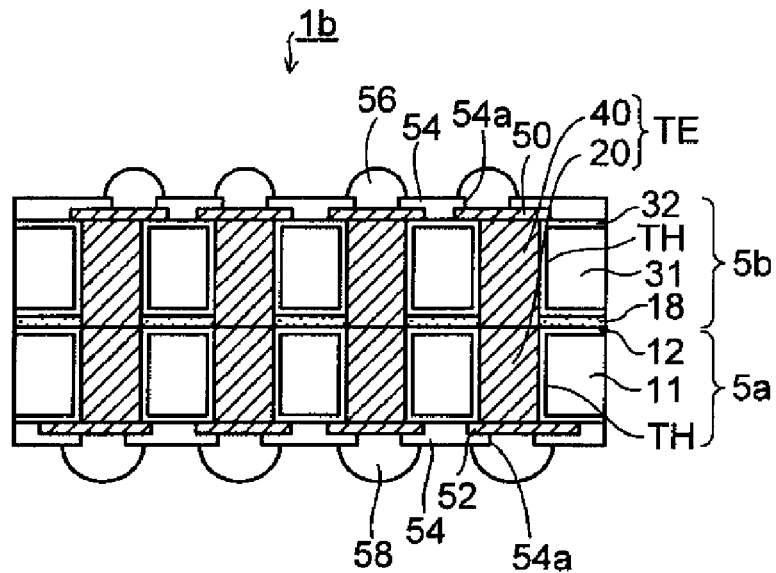
Figure 14:
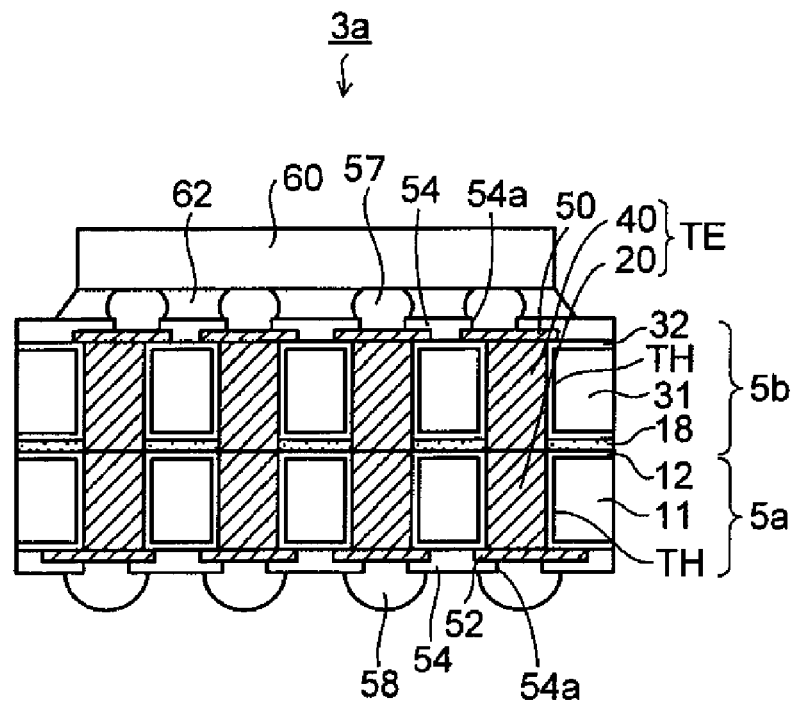
FIG. 14 is a sectional view showing an electronic component device using the wiring board according to the second embodiment of the invention.
Figure 15:
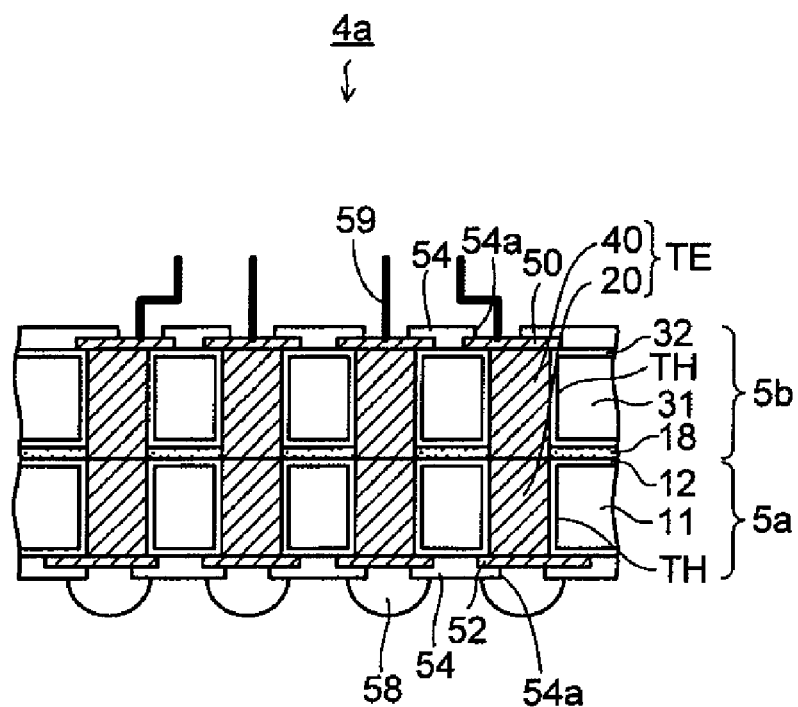
FIG. 15 is a sectional view showing a probe substrate using the wiring board according to the second embodiment of the invention.

FIGS. 12A to 13C are sectional views showing a method of manufacturing a wiring board according to a second embodiment of the invention, FIG. 14 is a sectional view showing an electronic component device, and FIG. 15 is a sectional view showing a probe substrate.

The second embodiment is characterized in that a second silicon wafer is stacked on a first silicon wafer and a feed-through conductor portion is then formed in a through hole of the second silicon wafer. In the second embodiment, detailed description of the same steps as those in the first embodiment will be omitted.

Referring to the method of manufacturing a wiring board according to the second embodiment, as shown in FIG. 12A, the steps in FIGS. 2A to 2E according to the first embodiment are first executed to form a first feed-through conductor portion 20 in a through hole TH of a first silicon wafer 10 (a first wafer substrate). A thickness of the first silicon wafer 10 is approximately 200 μm in the same manner as in the first embodiment.

As shown in FIG. 12B, next, a bonding resin layer 18 is formed in a part excluding the first feed-through conductor portion 20 over the first silicon wafer 10. Furthermore, there is prepared a second silicon wafer 30 (a second wafer substrate) shown in FIG. 12C. A through hole TH is provided on the second silicon wafer 30 and an insulating layer 32 is formed on both sides of the second silicon wafer 30 and an internal surface of the through hole TH.

The through hole TH of the second silicon wafer 30 is disposed corresponding to the first feed-through conductor portion 20 formed in the first silicon wafer 10. A thickness of the second silicon wafer 30 is set to be 100 to 200 μm.

In the second embodiment, a feed-through conductor portion is also formed in the through hole TH of the second silicon wafer 30 by electrolytic plating. In the same manner as in the first silicon wafer 10, therefore, it is preferable that an aspect ratio of the through hole TH of the second silicon wafer 30 should be set to be equal to or lower than four.

As shown in FIGS. 12C and 12D, the second silicon wafer 30 is provided on the first silicon wafer 10 in such a manner that the through hole TH of the second silicon wafer 30 is disposed on the first feed-through conductor portion 20 of the first silicon wafer 10. In the same manner as in the first embodiment, furthermore, heating/pressurization is carried out to cure the bonding resin layer 18. Consequently, the second silicon wafer 30 is bonded to the first silicon wafer 10.

As in the third bonding method described in the first embodiment, it is also possible to bond the insulating layer 12 formed on the first silicon wafer 10 to the insulating layer 32 formed on the second silicon wafer 30 based on an execution of a plasma treatment without using the bonding resin layer 18.

As in the fourth bonding method described in the first embodiment, alternatively, it is also possible to remove the insulating layer provided on the upper surface of the first silicon wafer 10, to use the second glass wafer 30a in place of the second silicon wafer 30, and to carry out anode bonding over the silicon of the first silicon wafer 10a and the lower surface of the second glass wafer 30a.

As shown in FIG. 13A, subsequently, the structure in FIG. 12D is disposed on a plating feeding member 16. Furthermore, a second feed-through conductor portion 40 is formed in the through hole TH of the second silicon wafer 30 by electrolytic plating utilizing the plating feeding member 16 and the first feed-through conductor portion 20 as a plating feeding path. Then, the plating feeding member 16 is removed from the first and second silicon wafers 10 and 30.

The second feed-through conductor portion 40 is formed in an electrical connection to the first feed-through conductor portion 20 provided thereunder. Also in the second silicon wafer 30, a thickness is set to be small, that is, approximately 200 μm and an aspect ratio of the through hole TH is set to be low, that is, four or less. Therefore, it is possible to eliminate a drawback that an unfilled through hole TH is generated or a time required for plating is increased.

As described in the first embodiment, an average plating rate becomes higher by an execution of the plating with a division as compared with the case in which the first and second feed-through conductor portions 20 and 40 are continuously formed through the electrolytic plating.

As shown in FIG. 13B, then, a wiring layer 50 to be connected to the second feed-through conductor portion 40 is formed on an upper surface of the second silicon wafer 30 in the same manner as in the first embodiment. Furthermore, a wiring layer 52 to be connected to the first feed-through conductor portion 20 is formed on a lower surface of the first silicon wafer 10.

Thereafter, a protection insulating layer 54 having an opening portion provided on connecting parts of the wiring layers 50 and 52 is formed on the lower surface of the first silicon wafer 10 and the upper surface of the second silicon wafer 30, respectively.

As shown in FIG. 13C, next, a bump electrode 56 is formed on the wiring layer 50 at the upper surface side of the second silicon wafer 30 in the same manner as in the first embodiment. Furthermore, an external connecting terminal 58 is formed on the wiring layer 52 at the lower surface side of the first silicon wafer 10.

Subsequently, the first and second silicon wafers 10 and 30 are cut into first and second silicon substrates 11 and 31 individually.

Consequently, a wiring board 1b according to the second embodiment is obtained.

As shown in FIG. 13C, the wiring board 1b according to the second embodiment has a basic structure in which a second substrate portion 5b is bonded onto a first substrate portion 5a through the bonding resin layer 18. The first substrate portion 5a includes the first silicon substrate 11, the through hole TH, the insulating layer 12 formed on both sides and the internal surface of the through hole TH, and the first feed-through conductor portion 20 filled in the through hole TH in the same manner as in the first embodiment.

Similarly, the second substrate portion 5b includes the second silicon substrate 31, the through hole TH, the insulating layer 32 formed on both sides and the internal surface of the through hole TH, and the second feed-through conductor portion 40 filled in the through hole TH.

In the same manner as in the first embodiment, a feed-through electrode TE penetrating through the wiring board 1b is constituted by the first and second feed-through conductor portions 20 and 40 which are disposed vertically.

In the second embodiment, an embedding resin is not formed between a side surface of the through hole TH in the second silicon substrate 31 and the second feed-through conductor portion 40, and the second feed-through conductor portion 40 is electrically insulated from the second silicon substrate 31 through the insulating layer 32.

Since the other elements are the same as those in the first embodiment, the same designations are given and description thereof will be omitted.

Also in the wiring board 1b according to the second embodiment, a substrate strength is increased additionally to obtain a stable handling property, and furthermore, the feed-through electrode TE (the first and second feed-through conductor portions 20 and 40) is formed with a high yield and production efficiency in the same manner as the wiring board 1 according to the first embodiment. In addition, it is possible to form the feed-through electrode TE having a low electrical resistance by the electrolytic plating.

Also in the second embodiment, it is also possible to use a semiconductor substrate other than silicon or an insulating substrate such as SiC or glass in place of the first and second silicon substrates 11 and 31 in the same manner as in the first embodiment.

In the same manner as in the first embodiment, the wiring board 1b according to the second embodiment is used as a mounting substrate for mounting an electronic component thereon. As shown in FIG. 14, a connecting part of an electronic component 60 (a semiconductor chip) is flip-chip connected to the connecting bump 56 provided on the upper surface side of the wiring board 1b in FIG. 13C, and the electronic component 60 is connected to the wiring board 1b through a connecting electrode 57.

Furthermore, an underfill resin 62 is filled in a clearance on a lower side of the electronic component 60. Consequently, an electronic component device 3a according to the second embodiment is obtained.

As shown in FIG. 15, the wiring board according to the second embodiment may be applied to a probe substrate in the same manner as in the first embodiment. As shown in FIG. 15, in a probe substrate 4a according to the second embodiment, a probe pin 59 is attached to the wiring layer 50 provided on the upper surface of the wiring board in a wafer state shown in FIG. 13B.

Furthermore, the external connecting terminal 58 is provided on the wiring layer 52 formed on the lower surface side of the wiring board in the wafer state. In the same manner as in the first embodiment, an electrical characteristic of a silicon wafer including an integrated circuit is evaluated.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A wiring board comprising:
    a first silicon substrate formed by a wafer and including a first feed-through conductor portion in a vertical direction formed in a first through hole;
    a second silicon substrate formed by a wafer, provided on the first silicon substrate and including a second feed-through conductor portion in the vertical direction formed in a second through hole, the second feed-through conductor portion being vertically aligned with the first feed-through conductor portion;
    a first insulating layer formed on upper and lower surfaces of the first silicon substrate and an internal surface of the first through hole;
    a second insulating layer formed on upper and lower surfaces of the second silicon substrate and an internal surface of the second through hole;
    the first silicon substrate and the second silicon substrate being stacked via a bonding resin layer formed on a surface area of the first silicon substrate excluding the first feed-through conductor portion; and
    a feed-through electrode comprising the first feed-through conductor portion and the second feed-through conductor portion being integrally formed,
    wherein the second feed-through conductor portion contacts the second insulating layer formed on the second silicon substrate and contacts the bonding resin layer.

2. The wiring board according to claim 1,
    wherein a bump electrode is formed on a wiring layer on an upper surface of the second silicon substrate, and
    wherein an external connection terminal is formed on a wiring layer on a lower surface of the first silicon substrate.

* * * * *